United States Patent [19]
Kuriyama

[11] Patent Number: 5,682,057
[45] Date of Patent: Oct. 28, 1997

[54] SEMICONDUCTOR DEVICE INCORPORATING A TEMPERATURE FUSE

[75] Inventor: Chojiro Kuriyama, Kyoto, Japan

[73] Assignee: Rohm Co. Ltd., Kyoto, Japan

[21] Appl. No.: 609,019

[22] Filed: Feb. 29, 1996

[30] Foreign Application Priority Data

Mar. 3, 1995 [JP] Japan ................... 7-044235

[51] Int. Cl.$^6$ .................. H01L 29/00; H01L 31/058
[52] U.S. Cl. .................. 257/529; 257/467; 257/666
[58] Field of Search .................. 257/665, 589, 257/467, 666

[56] References Cited

U.S. PATENT DOCUMENTS

| | | | |
|---|---|---|---|
| 3,558,989 | 1/1971 | Dameme et al. ............... | 257/665 |
| 4,157,486 | 6/1979 | Fegley . | |
| 4,945,398 | 7/1990 | Kurita et al. ............... | 257/665 |
| 5,097,247 | 3/1992 | Doerrwaechter . | |

FOREIGN PATENT DOCUMENTS 5235080  9/1993  Japan .

Primary Examiner—Mahshid D. Saadat
Assistant Examiner—S. V. Clark
Attorney, Agent, or Firm—Michael D. Bednarek; Kilpatrick Stockton LLP

[57] ABSTRACT

A semiconductor device is provided which comprises a semiconductor chip including at least one semiconductor element and at least two surface electrodes, at least two lead terminals one of which is electrically connected to a first one of the surface electrodes, a temperature fuse element provided adjacent to the semiconductor element, and a package commonly enclosing the semiconductor chip, the fuse element, and part of the lead terminals. The temperature fuse element includes a patterned conductor strip formed on an insulating surface to be melt-cut at a predetermined temperature. One end of the patterned conductor strip is electrically connected to a second one of the surface electrodes, whereas the other end of the patterned conductor strip is electrically connected to another of the lead terminals.

13 Claims, 5 Drawing Sheets

SEMICONDUCTOR DEVICE INCORPORATING A TEMPERATURE FUSE

BACKGROUND OF THE INVENTION

1. Field of the Invention

This invention relates to a semiconductor ice such as transistor incorporating, in the same package, a temperature fuse element which is designed to be melt-cut upon an excessive temperature rise.

2. Description of the Related Art

In general, a semiconductor device such as transistor undergoes heat generation upon passage of a large current or application of a high voltage, and such heat generation may adversely affect the properties of the semiconductor device. Specifically, the semiconductor device which is excessively heated may behave differently from its intended function, thereby causing passage of an excessive current through a circuit which is connected to the semiconductor device. As a result, the other electronic components included in the same circuit may be unexpectedly damaged.

In view of this, Japanese Patent Application Laid-open No. 5-235080 proposes a semiconductor device which incorporates a temperature fuse wire made of solder connecting a semiconductor chip to a lead terminal. The temperature fuse wire is thermally melt-cut when the temperature of the semiconductor device rises to an excessively high level, thereby protecting the related electronic component in the same circuit. However, the prior art semiconductor device disclosed in this Japanese document is still disadvantageous for the following reasons.

First, since the temperature fuse wire is made of solder which is a relatively soft metal, it may be easily damaged or constrictively deformed at the time of wire bonding. Once the cross section of the solder wire is abruptly reduced, it generates heat at the constricted portion because the resistivity of the solder wire is higher than that of a gold, aluminum or copper wire which is widely used for wire bonding. As a result, the solder fuse wire may be thermally melt-cut due to its low melting point even while a normal operating current passes through the semiconductor device, thus failing to serve as an intended temperature fuse.

Secondly, since the solder fuse wire is weakened at a cross-sectionally constricted portion, it may be broken or cut even under normal operating vibration of the apparatus in which the semiconductor device is incorporated. This is particularly true because of repetitive heat generation at the cross-sectionally constricted portion of the solder fuse wire.

SUMMARY OF THE INVENTION

It is, therefore, an object of the present invention to provide a semiconductor device which, while incorporating a temperature fuse, overcomes the above-described problems.

According to the present invention, there is provided a semiconductor device comprising:

a semiconductor chip including at least one semiconductor element and at least two surface electrodes;

at least two lead terminals one of which is electrically connected to a first one of the surface electrodes;

a temperature fuse element provided adjacent to the semiconductor element, the temperature fuse element including a patterned conductor strip formed on an insulating surface to be melt-cut at a predetermined temperature, one end of the patterned conductor strip being electrically connected to a second one of the surface electrodes, the other end of the patterned conductor strip being electrically connected to another of the lead terminals; and a package commonly enclosing the semiconductor chip, the fuse element, and part of the lead terminals.

Preferably, the conductor strip is made of a low-melting-point metal such as solder. The term "solder" as herein used should be interpreted in its broadest sense. A typical example of solder is an alloy of lead and tin in suitable proportions. However, any other solder composition is acceptable.

The conductor strip may have a pair of enlarged wider end portions and a narrower intermediate portion, and the intermediate portion of the conductor strip may be covered by a soft elastic resin member. Further, an electrode pad may be formed on each enlarged end portion of the conductor strip.

According to one embodiment of the present invention, the insulating surface is provided by a substrate which is separate from the semiconductor chip. In this case, the substrate may have an insulating surface layer for providing the insulating surface. Further, due to separation between the semiconductor chip and the temperature fuse element, said one end of the conductor strip is electrically connected to the second one of the surface electrodes through a metal wire.

In case where the semiconductor device is a transistor, the semiconductor chip and the substrate may be commonly mounted on a metal base plate which has an integral lead terminal.

According to another embodiment of the present invention, the insulating surface is provided by an insulating surface layer formed on the semiconductor chip. In this case, the conductor strip may preferably extend from the second one of the surface electrodes to an electrode pad formed on the insulating surface layer.

Again, in case where the semiconductor device is a transistor, the semiconductor chip is mounted on a metal base plate which has an integral lead terminal.

Other objects, features and advantages of the present invention will be fully understood from the following detailed description given with reference to the accompanying drawings.

DETAILED DESCRIPTION OF THE PREFERRED EMBODIMENTS

Figure 1:
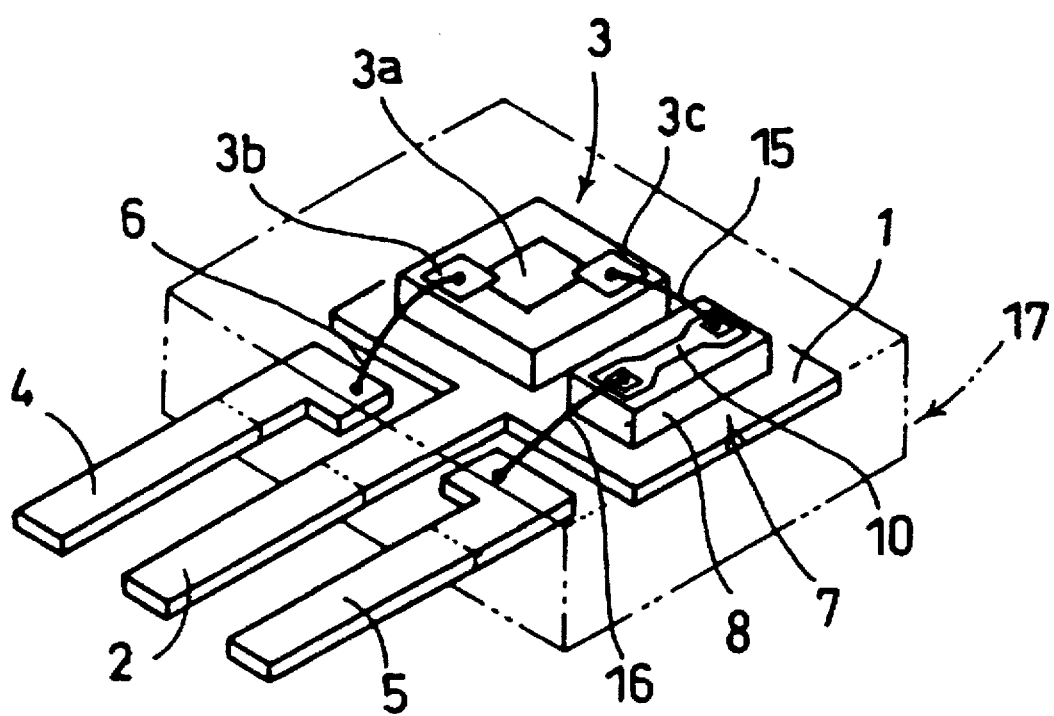
FIG. 1 is a perspective view showing a fused semiconductor device embodying the present invention.
Figure 2:
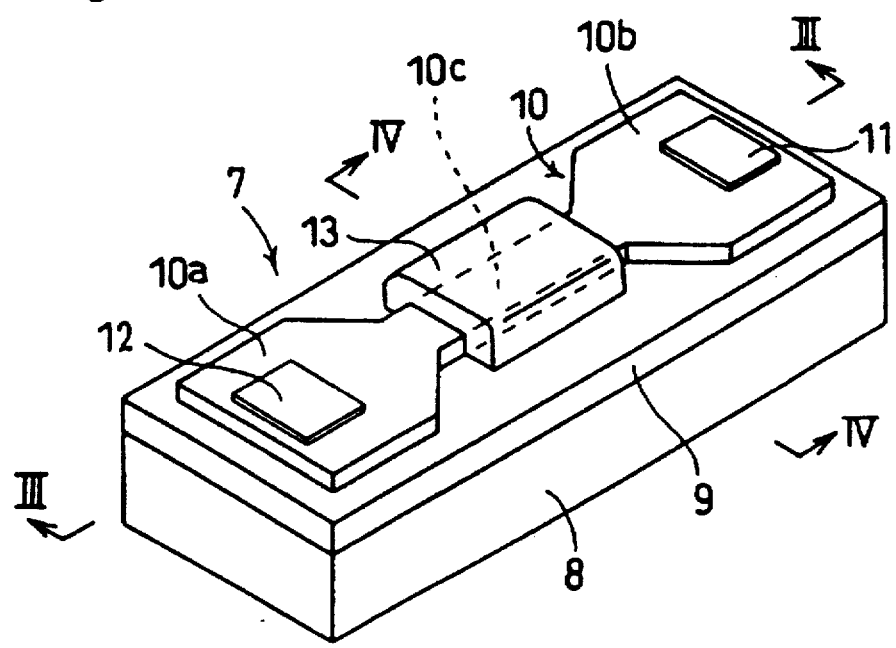
FIG. 2 is a perspective view showing a temperature fuse element incorporate the semiconductor device of FIG. 1.

FIGS. 1 through 2 of the accompanying drawings illustrate a first embodiment of the present invention wherein a temperature fuse element is provided separately from a semiconductor chip but incorporated in a common resin package together with the semiconductor chip. In this embodiment, the semiconductor chip is a high power transistor.

Specifically, as shown in FIG. 1, the fused semiconductor device of the first embodiment comprises a metal base plate 1 having an integral first lead terminal 2. A semiconductor chip 3 is bonded (by die bonding) on the base plate 1 in electrical conduction therewith. The semiconductor chip 3 has a transistor element 3a (only schematically shown) and a pair of surface electrodes 3b, 3c for the transistor element 3a. For the convenience of the following description, one electrode 3b is referred to as "first electrode", whereas the other electrode 3c is referred to as "second electrode".

The first lead terminal 2 of the base plate 1 is flanked by second and third lead terminals 4, 5. According to the first embodiment, the second lead terminal 4 has an inner end electrically connected to the first electrode 3b of the semiconductor chip 3 through a high-melting-point metal wire 6 made of gold (Au), aluminum (Al) or copper (Cu) for example.

Figure 3:
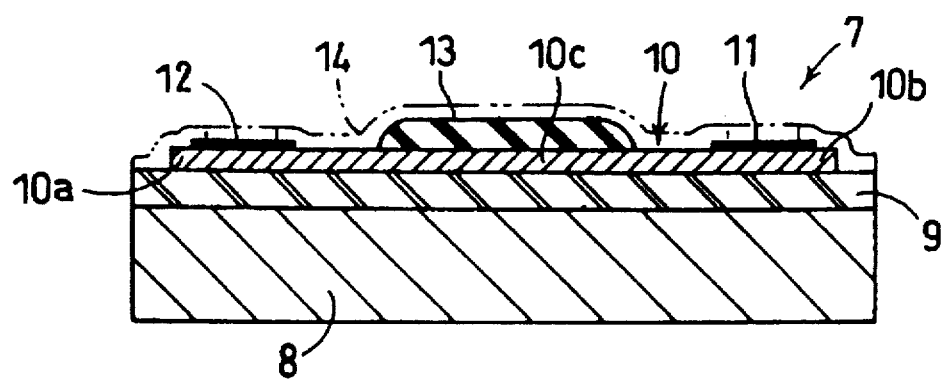
FIG. 3 is a sectional view of the same fuse element taken along lines III—III in FIG. 2.
Figure 4:
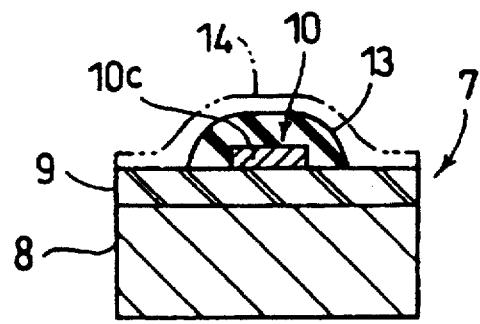
FIG. 4 is a sectional view of the same fuse element taken along lines IV—IV in FIG. 2.

The base plate 1 also supports a temperature fuse element 7 provided separately from the semiconductor chip 3 but arranged adjacent thereto. As shown in FIGS. 2 through 4, the temperature fuse element 7 comprises a chip substrate 8 made of silicon wafer. The substrate 8 is formed with an upper insulating surface layer 9 made of silicon oxide for example. The insulating surface layer 9 is formed with a patterned conductor strip 10 made of a low-melting-point metal film such as solder film. The conductor strip 10 has enlarged wider end portions 10a, 10b and an intermediate narrower portion 10c between the enlarged wider portions 10a, 10b.

The wider end portions 10a, 10b of the conductor strip 10 are formed with electrodes pads 11, 12, respectively, whereas the intermediate narrower portion 10c is covered by a soft elastic resin member 13 made of silicone resin for example. Further, the conductor strip 10 together with the resin member 13 is covered by a protective coating 14 which has windows at the respective electrode pads 11, 12. The protective coating 14 may be made of a heat-resistant resin.

One electrode pad 11 of the fuse element 7 is electrically connected to the second electrode 3c of the semiconductor chip 3 through a high-melting-point metal wire 15 made of gold, aluminum or copper for example. Similarly, the other electrode pad 12 of the fuse element 7 is electrically connected to the third lead terminal 5 through a high-melting-point metal wire 16 made of gold, aluminum or copper for example.

The base plate 1, the semiconductor chip 3, the temperature fuse 7 and the inner ends of the first to third lead terminals 2, 4, 5 are commonly enclosed in a molded package 17 made of a thermosetting resin for example, as shown in FIG. 1.

In operation, the semiconductor device described above is arranged between a power source circuit (not shown) and a load circuit (not shown). If the semiconductor chip 3 generates excessive heat due to passage of an overcurrent or by application of an excessively high voltage, the generated heat is transmitted to the nearby temperature fuse element 7. As a result, when the temperature of the fuse element 7 rises to an excessively high level, the narrower intermediate portion 10c of the patterned conductor strip 10 is melt-cut, thereby opening the load circuit. In this way, the other electronic components (not shown) incorporated in the load circuit are prevented from being subjected to secondary damages.

Further, since the temperature fuse element 7 is provided by the patterned conductor strip 10 formed on the insulating surface layer 9 of the chip substrate 8, the patterned conductor strip 10 is much less likely to encounter unexpected mechanical damages and constrictive deformation, as opposed to the prior art fused semiconductor device which incorporates a solder fuse wire. Thus, the fuse element 7 is reliably prevented from being prematurely melt-cut by passage of a normal operating current or from being mechanically cut due to vibration.

The temperature fuse element 7 of the semiconductor device may be conveniently manufactured in the following manner.

Figure 5:
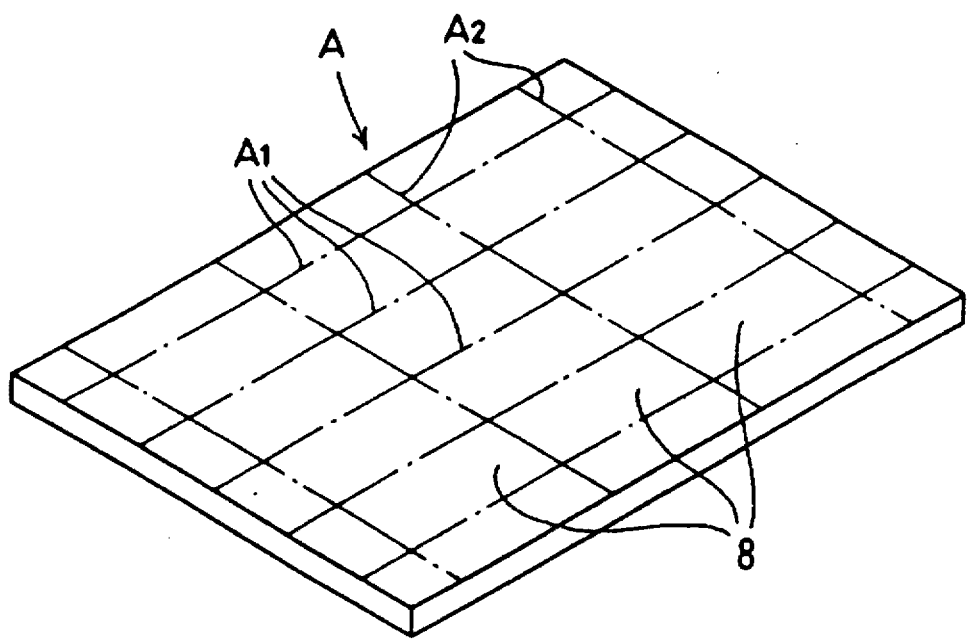
FIGS. 5 through 8 are perspective views showing the successive steps of making the temperature fuse element.

First, as shown in FIG. 5, a master silicon wafer A is prepared which provides a plurality of chip substrates 8 when later cut along longitudinal and transverse cutting lines A1, A2 in the final process step.

Figure 6:
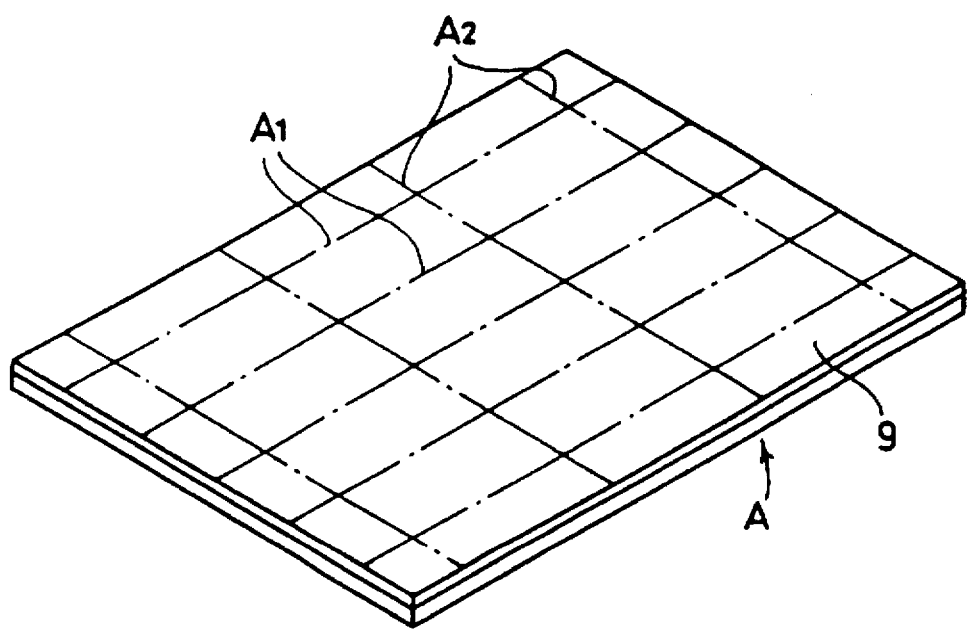

Then, as shown in FIG. 6, an overall insulating surface layer 9 is formed on the master silicon wafer A by a suitable known method such as thermal oxidation, PV sputtering or plasma CVD for example. The insulating surface layer 9 may be made of an oxide or nitride of silicon for example.

Figure 7:
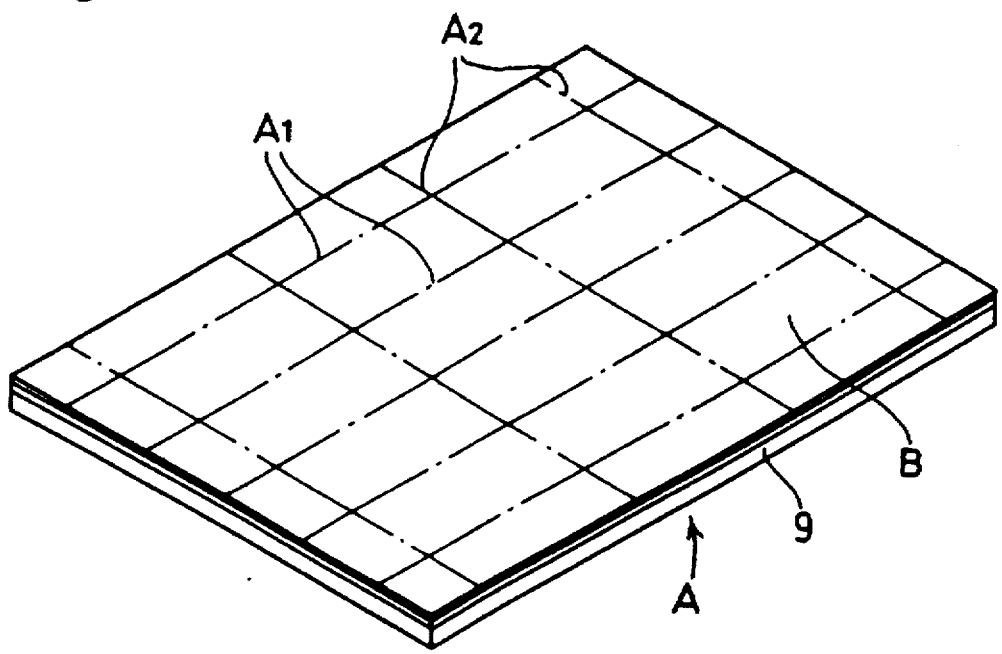

Then, as shown in FIG. 7, a thin layer B of a low-melting-point metal is formed over the entire surface of the insulating surface layer 9 by a suitable known method such as sputtering. An example of low-melting-point metal is solder.

Figure 8:
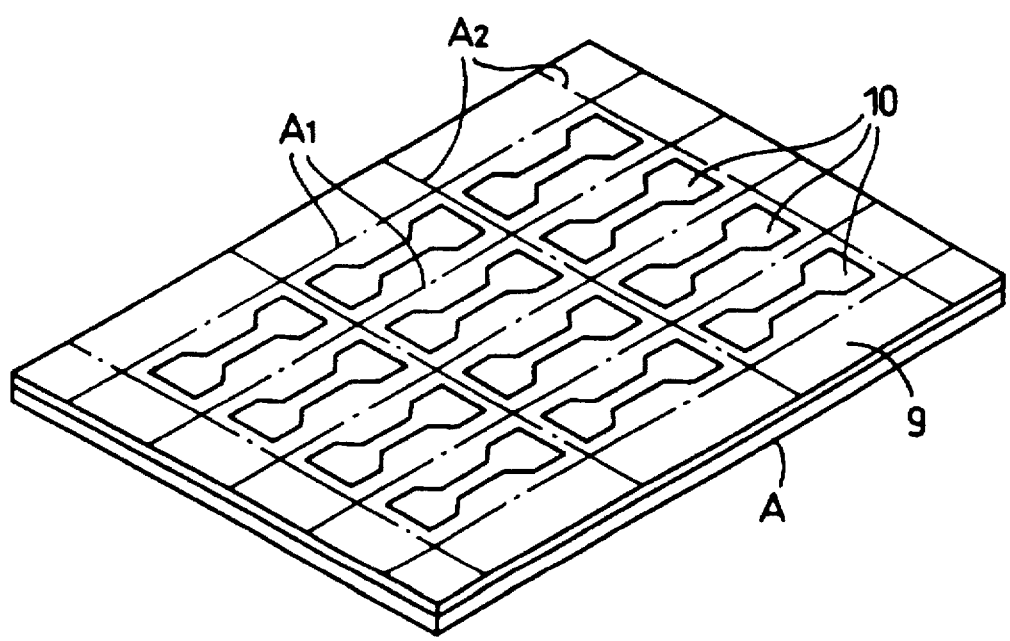

Then, as shown in FIG. 8, the metal layer B is patterned by photolithography to provide a plurality of conductor strips 10 in corresponding relation to the plurality of chip substrates 8 which are later provided. The process of photolithography includes forming a photoresist layer (not shown) over the metal layer B, forming on the photoresist layer a photomask (not shown) which has a plurality of windows each corresponding in configuration to the conductor strip 10, irradiating the photoresist layer with light, taking the photomask away for development to remove the portions of the photoresist other than the windows, and etching the portions of the metal layer B other than the windows to leave the plurality of conductor strips Then, two electrodes pads 11, 12 (see FIGS. 2 and 3) are formed on the respective enlarged end portions 10a, 10b of each conductor strip 10 by a known printing method.

Then, a soft elastic resin member 13 is deposited over the intermediate portion 10c of the conductor strip 10 (see FIGS. 2–4) by a known method.

Then, a protective coating 14 is formed to cover the conductor strip 10 together with the elastic resin member 13 with windows formed at the respective electrode pads 11, 12.

Finally, the master silicon wafer A thus treated is divided into a plurality of temperature fuse elements 7 by cutting along the longitudinal and transverse cutting lines A1, A2.

It should be noted that the chip substrate 8 of the temperature fuse element 7 may not be made of silicon wafer. Instead, the chip substrate 8 may be made of a heat-resistant insulating material such as a ceramic material. In this case, the patterned conductor strip 10 may be formed on the upper surface of the chip substrate 8 directly or indirectly via an insulating surface layer.

Figure 9:
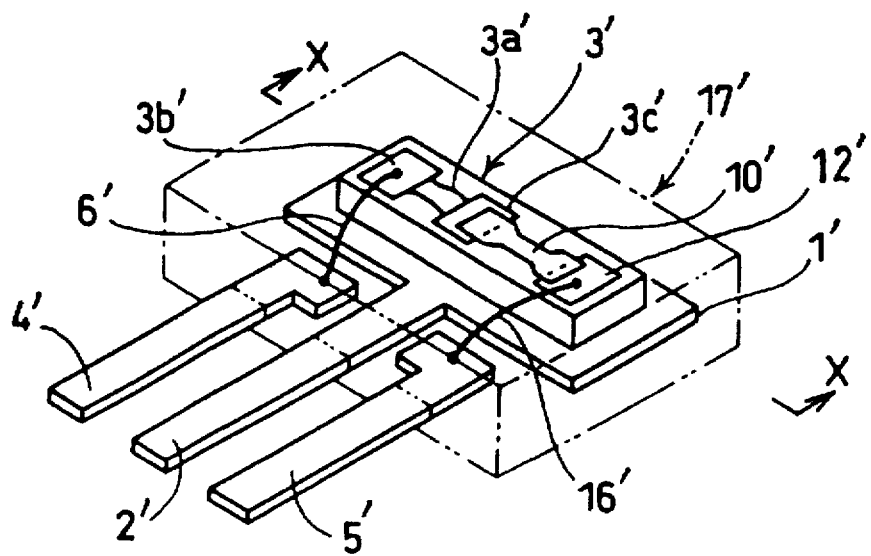
FIG. 9 is a perspective view showing a modified fused semiconductor device embodying the invention.
Figure 10:
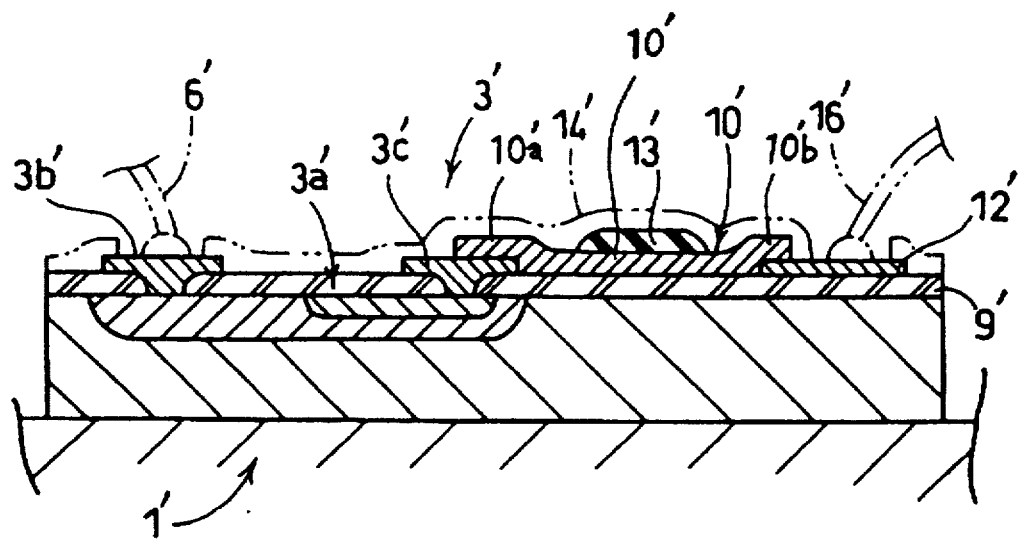
FIG. 10 is a sectional view showing the modified semiconductor device along lines X—X in FIG. 9.

FIGS. 9 and 10 illustrate a second embodiment of the present invention wherein a temperature fuse element is integrated onto a semiconductor chip. In this embodiment, the semiconductor chip is again a high power transistor.

Specifically, the fused semiconductor device of the second embodiment comprises a metal base plate 1' having an integral first lead terminal 2'. A semiconductor chip 3' made of a silicon wafer is bonded on the base plate 1' in electrical conduction therewith. The semiconductor chip 3' has a transistor element 3a' and a pair of surface electrodes 3b', 3c' (first and second electrodes, respectively) for the transistor element 3a'. The transistor element 3a' may be provided by diffusion of suitable impurities into the silicon wafer, as is well known.

The first lead terminal 2' of the base plate 1' is flanked by second and third lead terminals 4', 5'. According to the second embodiment, the second lead terminal 2' has an inner end electrically connected to the first electrode 3b' of the semiconductor chip 3' through a high-melting-point metal wire 6' made of gold (Au), aluminum (Al) or copper (Cu) for example.

The semiconductor chip 3' has an upper surface entirely formed with an insulating surface layer 9' except at portions where the first and second electrodes 3b', 3c' for the transistor elements 3a' are provided. The insulating surface layer 9' is formed with a patterned conductor strip 10' as a temperature fuse element together with an electrode pad 12'. The conductor strip 10' extends from the second electrode 3c' of the transistor element 3a' to the electrode pad 12'.

Like the first embodiment, the conductor strip 10' has enlarged wider end portions 10a', 10b' and an intermediate narrower portion 10c' between the enlarged wider portions 10a, 10b. The intermediate narrower portion 10c' is covered by a soft elastic resin member 13' made of silicone resin for example. Further, the conductor strip 10' together with the resin member 13' and the transistor element 3a' is covered by a protective coating 14' which has windows at the first electrode 3b' and the electrode pad 12', and the electrode pad 12' is electrically connected to the third lead terminal 5' t through a high-melting-point metal wire 16' made of gold, aluminum or copper for example.

The base plate 1' and the semiconductor chip 3' incorporating the temperature fuse 10' are commonly enclosed in a molded package 17' made of a thermosetting resin for example together with the inner ends of the first to third lead terminals 2', 4', 5', as shown in FIG. 9.

According to the second embodiment described above, the transistor element 3a' and the temperature fuse element 10' (patterned conductor strip) are formed on the same semiconductor chip 3' adjacent to each other. Thus, the heat generated by the transistor element 3a' can be immediately transmitted to the temperature fuse element 10', so that it is possible to greatly improve the responsiveness of the temperature fuse element 10' while also realizing a size and cost reduction of the semiconductor device as a whole.

The preferred embodiments of the present invention being thus described, it is obvious that the same may be varied in many ways. For instance, while the above-described embodiments refer only to a high output transistor as an example of semiconductor device, the present invention is applicable to other semiconductor devices which include MOB transistor, field effect transistor (FET), thyristor, TRIAC (triode AC switch). Further, the present invention is additionally applicable to an array type semiconductor device such as transistor array or diode array which includes a plurality of transistor elements or diode elements. Such variations are not to be regarded as a departure from the spirit and scope of the present invention, and all such modifications as would be obvious to those skilled in the art are intended to be included within the scope of the following claims.

I claim:

1. A semiconductor device comprising:

a semiconductor chip including at least one semiconductor element and at least one semiconductor element and at least two surface electrodes;

at least two lead terminals one of which is electrically connected to a first one of the surface electrodes;

a temperature fuse element provided adjacent to the semiconductor element, the temperature fuse element including a patterned flat conductor strip formed on a flat insulating surface to be melt-cut at a predetermined temperature, one end of the patterned conductor strip being electrically connected to a second one of the surface electrodes, the other end of the patterned conductor strip being electrically connected to another of the lead terminals; and a package separate from the insulating surface for commonly enclosing the semiconductor chip, the fuse element, and part of the lead terminals.

2. The semiconductor device according to claim 1, wherein the conductor strip is made of a low-melting-point metal.

3. The semiconductor device according to claim 2, wherein the conductor strip is made of solder.

4. The semiconductor device according to claim 1, wherein the conductor strip has a pair of enlarged wider end portions and a narrower intermediate portion.

5. The semiconductor device according to claim 4, wherein the intermediate portion of the conductor strip is covered by a soft elastic resin member.

6. The semiconductor device according to claim 4, wherein an electrode pad is formed on each enlarged end portion of the conductor strip.

7. The semiconductor device according to claim 1, wherein the insulating surface is provided by a substrate which is separate from the semiconductor chip.

8. The semiconductor device according to claim 7, wherein the substrate has an insulating surface layer which provides the insulating surface.

9. The semiconductor device according to claim 7, wherein said one end of the conductor strip is electrically connected to the second one of the surface electrodes through a metal wire.

10. The semiconductor device according to claim 7, wherein the semiconductor chip and the substrate are commonly mounted on a metal base plate which has an integral lead terminal.

11. The semiconductor device according to claim 1, wherein the insulating surface is provided by an insulating surface layer formed on the semiconductor chip.

12. The semiconductor device according to claim 11, wherein the conductor strip extends from the second one of the surface electrodes to an electrode pad formed on the insulating surface layer.

13. The semiconductor device according to claim 11, wherein the semiconductor chip is mounted on a metal base plate which has an integral lead terminal.

* * * * *